US011056668B2

(12) United States Patent
Miyamoto et al.

(10) Patent No.: US 11,056,668 B2
(45) Date of Patent: Jul. 6, 2021

(54) DISPLAY DEVICE

(71) Applicant: Japan Display Inc., Tokyo (JP)

(72) Inventors: Mitsuhide Miyamoto, Tokyo (JP);
Hajime Akimoto, Tokyo (JP); Yuko Matsumoto, Tokyo (JP); Yusuke Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 20 days.

(21) Appl. No.: 16/445,782

(22) Filed: Jun. 19, 2019

(65) Prior Publication Data

US 2019/0393442 A1 Dec. 26, 2019

(30) Foreign Application Priority Data

Jun. 21, 2018 (JP) .............................. JP2018-117904

(51) Int. Cl.
*H01L 51/52* (2006.01)
*H01L 51/50* (2006.01)
*H01L 27/32* (2006.01)

(52) U.S. Cl.
CPC ...... *H01L 51/5221* (2013.01); *H01L 27/3276* (2013.01); *H01L 51/5012* (2013.01); *H01L 51/5206* (2013.01); *H01L 2251/301* (2013.01)

(58) Field of Classification Search
CPC ............. H01L 51/5221; H01L 51/5012; H01L 27/3276; H01L 51/5206; H01L 2251/301; H01L 27/3258
See application file for complete search history.

(56) References Cited

U.S. PATENT DOCUMENTS

| 9,224,965 | B2* | 12/2015 | Han | ................ | H01L 51/0533 |
| 2001/0011868 | A1 | 8/2001 | Fukunaga et al. | | |
| 2010/0102335 | A1* | 4/2010 | Takagi | ................ | H01L 27/3276 |
| | | | | | 257/88 |
| 2018/0006098 | A1* | 1/2018 | Hong | ................ | H01L 27/3248 |

FOREIGN PATENT DOCUMENTS

JP 2011-009790 A 1/2011

* cited by examiner

*Primary Examiner* — Yasser A Abdelaziez
(74) *Attorney, Agent, or Firm* — Michael Best & Friedrich LLP

(57) ABSTRACT

A display device has a first electrode provided corresponding to each of a plurality of pixels in a region in which the plurality of pixels is provided, a second electrode provided over the plurality of pixels and extending to a contact region provided outside the pixel region, a light emitting layer provided between the first electrode and the second electrode, a third electrode provided in the contact region, an organic insulating layer covering the third electrode and provided with a contact hole exposing the third electrode, and a connection portion between the second electrode and the third electrode in the contact hole, wherein the maximum distance between any two points on the outer periphery of the connection portion is 1 μm or more and 100 μm or less.

4 Claims, 10 Drawing Sheets

DISPLAY DEVICE

CROSS REFERENCE TO RELATED APPLICATIONS

This application is based on and claims the benefit of priority from the prior Japanese Patent Application No. 2018-117904, filed on Jun. 21, 2018, the entire contents of which are incorporated herein by reference.

FIELD

An embodiment of the present invention relates to a display device.

BACKGROUND

An organic electroluminescent display device using organic electroluminescent elements exists as a display device which displays images.

In the case of a top-emission type organic electroluminescent display device, a transparent electrode or a semi-transparent electrode is used as an upper electrode since light is extracted from a light emitting layer of the organic electroluminescent element through the upper electrode. When using a microcavity effect to improve luminous efficiency, as described in Japanese Laid-Open Patent Publication Number 2011-009790, a semi-light transmissive material such as a MgAg alloy is used as an electrode material for the upper electrode.

SUMMARY

According to an embodiment of the present invention, a display device is provided including a first electrode provided corresponding to each of a plurality of pixels in a pixel region in which the plurality of pixels are provided, a second electrode provided throughout the plurality of pixels and extending to a contact region provided outside the pixel region, a light emitting layer provided between the first electrode and the second electrode, a third electrode provided in the contact region, an organic insulating layer covering the third electrode and provided with a contact hole exposing the third electrode, and a connection portion between the second electrode and the third electrode provided in the contact hole in which the maximum distance between any two points on the outer periphery of the connection portion is 1 μm or more and 100 μm or less.

According to an embodiment of the present invention, a display device is provided including a first electrode provided corresponding to each of a plurality of pixels in a pixel region in which the plurality of pixels is provided, a second electrode provided throughout the plurality of pixels and extending to a contact region adjacent to the pixel region in a peripheral region provided surrounding the pixel region, a light emitting layer provided between the first electrode and the second electrode, a third electrode provided in the contact region and electrically connected to the second electrode, and a plurality of island-shaped organic layers provided in the contact region, at least one of which is within a range of 1 μm to 100 μm from any point.

DESCRIPTION OF EMBODIMENTS

Figure 1:
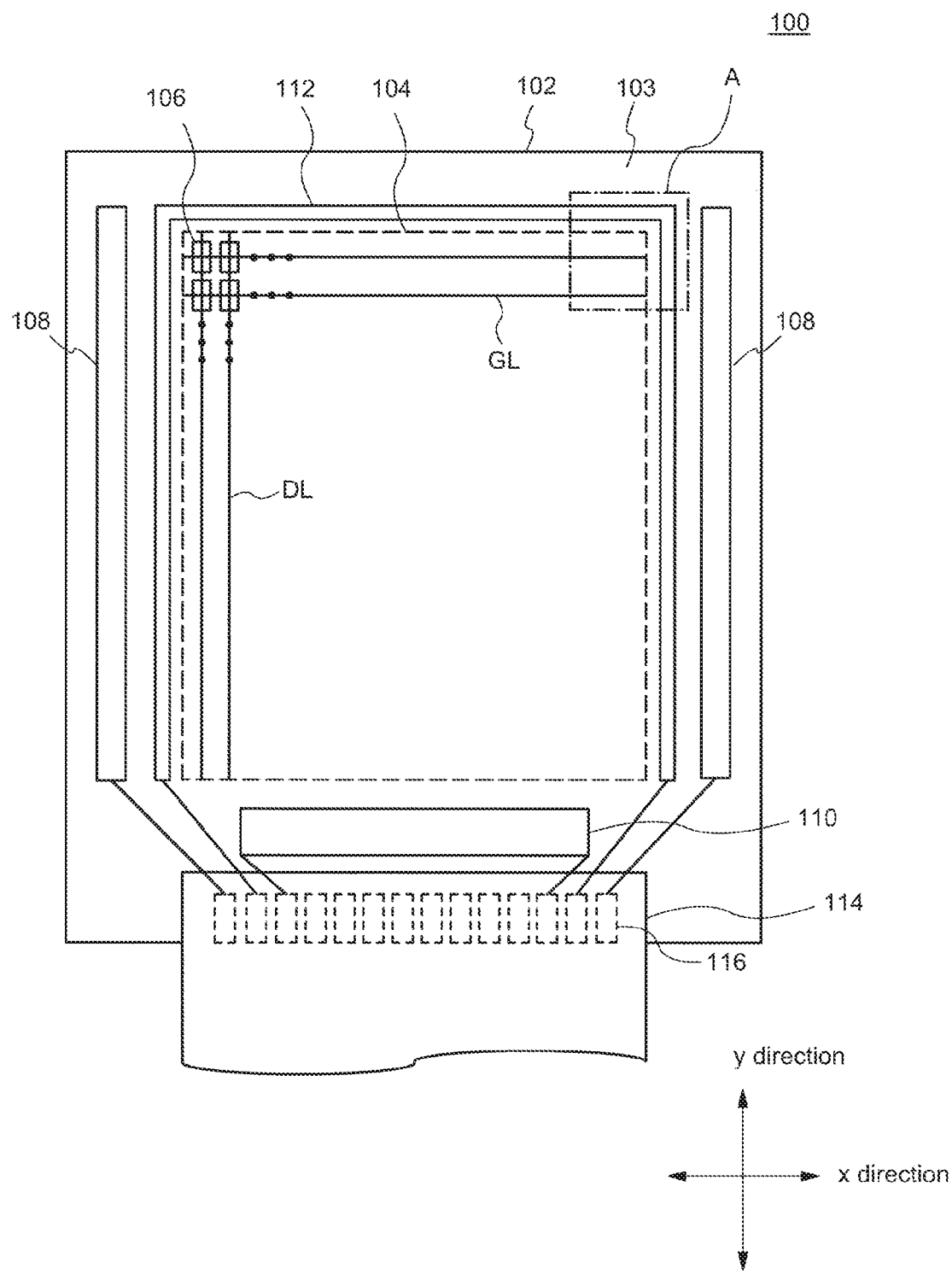
FIG. 1 is a schematic view showing the structure of an organic electroluminescent display device according to an embodiment of the present invention.

When an upper electrode is a counter electrode, the counter electrode and an electrode provided in a wiring substrate are electrically connected in a contact region provided outside the display region of the organic electroluminescent display device which displays images. Since the adhesion of an MgAg alloy to an inorganic film is low, when the counter electrode is formed of an MgAg alloy, the counter electrode may be peeled off in the contact region, reducing the yield of the organic electroluminescent display device.

Considering the problem above, an objective of the present invention is to prevent the peeling of the MgAg film in the contact region and to improve the yield of an organic electroluminescent display device.

Hereinafter, embodiments of the present invention will be described with reference to the drawings. However, the present invention may be implemented in many different ways, and interpretation should not be limited to the content exemplified in the embodiments below. In order to provide a clearer explanation, some components of the drawings such as the width, thickness, shape, and the like are represented schematically, however, these are merely examples, and do not limit the interpretation of the present invention. In the present specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In the present specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a cross-sectional view, the side on which the pixel region and contact region are arranged with respect to the main surface of the substrate will be described as "above" and the other side will be described as "below."

Additionally, in the present specification, expressions such as "α includes A, B, or C," "α includes any of A, B, and C," or "a includes one of A, B, and C selected from a group composed thereof," unless otherwise specified, does not exclude cases in which a includes a plurality of combinations of A·C. Further, these expressions do not exclude cases in which a includes other elements.

Additionally, in the present specification, "display device" indicates a device which displays images using organic electroluminescent elements. Accordingly, this includes display devices having a display module (also known as display panels) including organic electroluminescent elements and other elements with respect to the display module (for example, cover glass and the like.)

First Embodiment

FIG. 1 is a schematic view showing the structure of an organic electroluminescent display device 100 according to an embodiment of the present invention, and shows a schematic structure of the organic electroluminescent display device 100 in a plan view. In the present specification, a state in which the organic electroluminescent display device 100 is viewed from the direction perpendicular to the screen (image region) is referred to as a "plan view". In FIG. 1, a direction in which a gate line (scanning line GL) described below extends is shown as an x direction, and a direction in which a video signal line (video signal line DL) described below extends is shown as a y direction.

In the display device 100, a pixel region 104, a peripheral region 103, a first drive circuit 108, a second drive circuit 110, and a flexible printed circuit 114 are provided above a substrate 102. A plurality of pixels 106 are arranged in the pixel region 104. The peripheral region 103 is provided in the periphery of the pixel region 104. In the peripheral region 103, the first drive circuit 108, the second drive circuit 110, and the flexible printed circuit 114 are arranged. The first drive circuit 108 outputs a scanning signal to each pixel 106 in the pixel region 104 via the gate line GL, and the second drive circuit 110 outputs a video signal to each pixel 106 via the video signal line DL. The flexible printing circuit 114 is provided with a terminal electrode 116. A signal and power for driving the display device 100 are input to the terminal electrode 116 from an external circuit.

Although not shown in detail in FIG. 1, the pixel 106 includes an organic electroluminescent element. Details of the organic electroluminescent element are described below. The organic electroluminescent element includes a first electrode individually formed corresponding to each pixel 106, a second electrode formed substantially on one surface of the pixel region 104, and an organic layer between the first electrode and the second electrode. In the present embodiment, the display device 100 is a top-emission type display device which extracts light from the upper side of the organic electroluminescent element.

In the peripheral region 103, a contact region 112 is provided outside the pixel region 104 adjacent to the pixel region 104. The contact hole 112 is a region in which the second electrode of the organic electroluminescent element is electrically connected to the third electrode connected to the terminal electrode 116. In the present embodiment, the second electrode substantially overlap the entire surface of the contact region 112. The third electrode may be connected to the terminal electrode 116 via a wiring provided in the substrate 102. The third electrode may be a wiring provided in the substrate 102 and connected to the terminal electrode 116.

Figure 2:
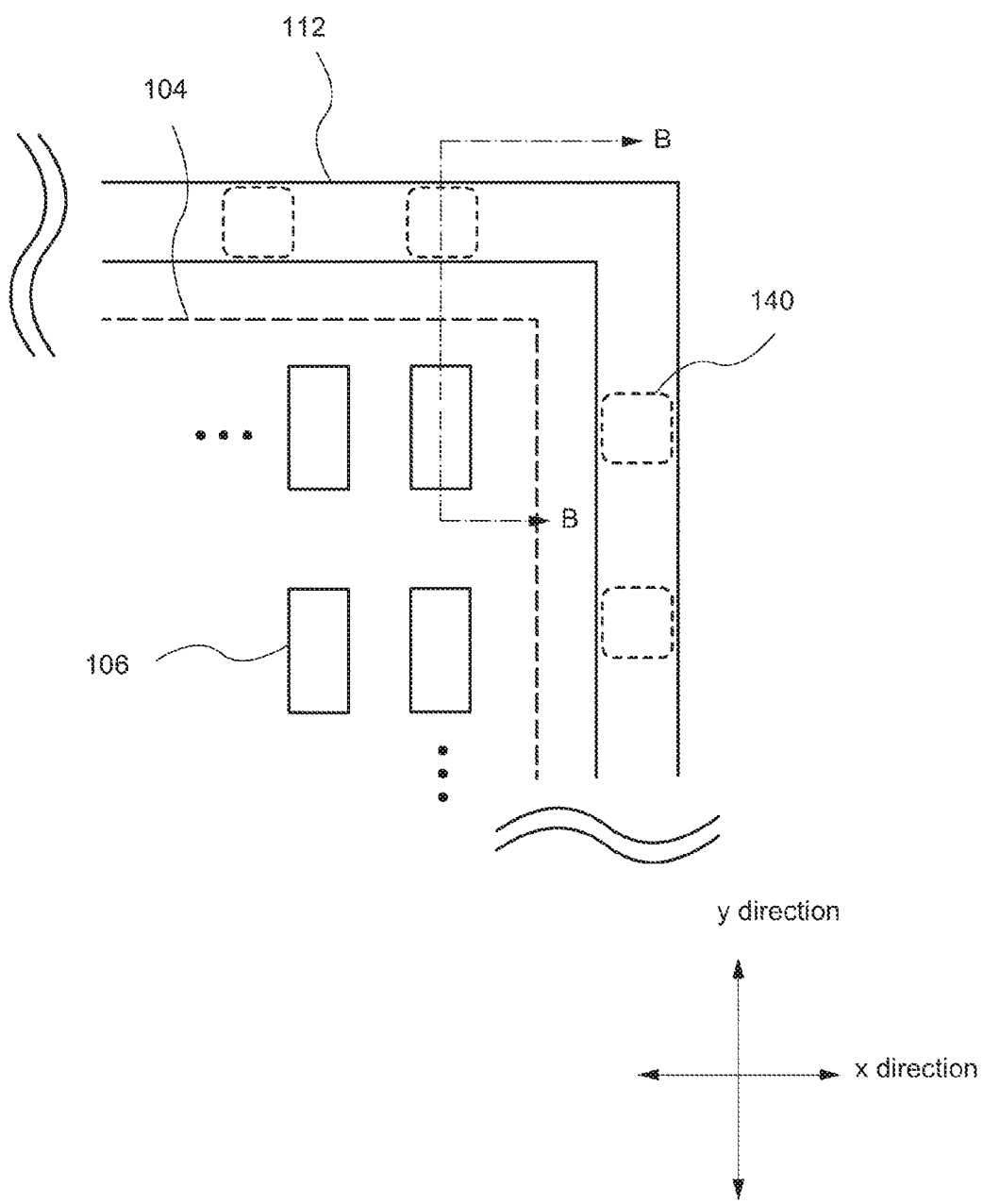
FIG. 2 is an enlarged view of a region A shown in FIG. 1.

FIG. 2 is an enlarged view of a region A shown in FIG. 1. As shown in FIG. 2, in the contact region 112, the second electrode is connected to the third electrode via a plurality of contact holes 140. The contact hole 140 is provided with a connection portion in which the second electrode and the third electrode are connected. The maximum distance between any two points on the outer periphery of the connection portion between the second electrode and the third electrode in the contact hole 140 is 1 μm or more and 100 μm or less.

Figure 3:
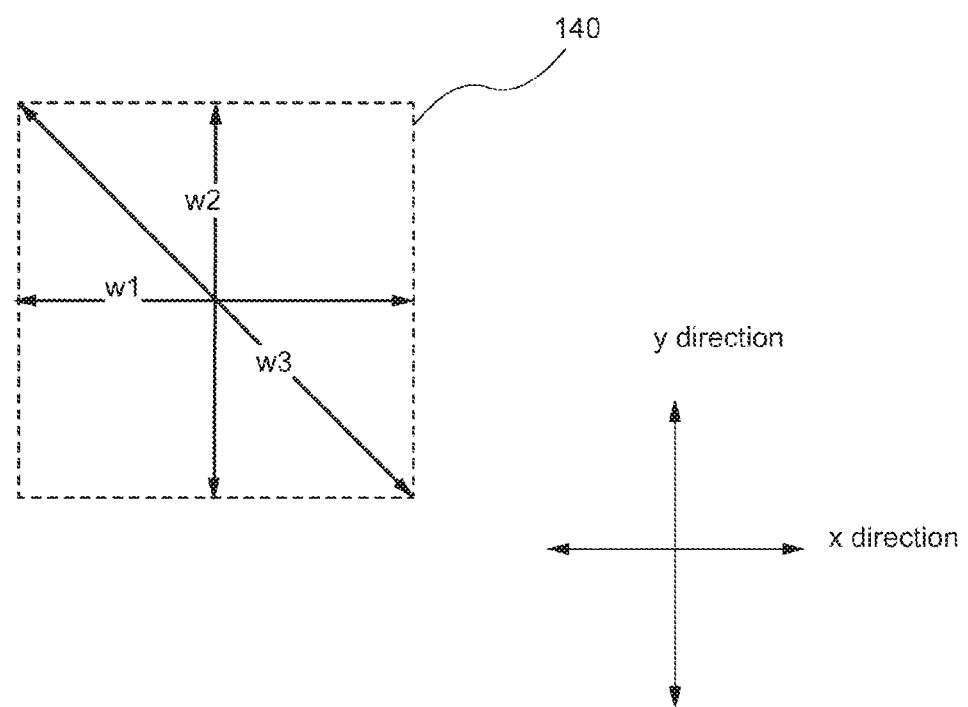
FIG. 3 is an enlarged view of a contact hole shown in FIG. 2.

FIG. 3 is an enlarged view of the contact hole 140 shown in FIG. 2. When the second electrode overlaps the entire contact hole 140 as in the present embodiment, the outer periphery of the connection portion with the second electrode and the third electrode corresponds to the outer periphery of the bottom of the contact hole 140. Therefore, the maximum distance between any two points on the outer periphery of the bottom of the contact hole 140 is 1 μm or more and 100 μm or less. That is, as shown in FIG. 3, when the contact hole 140 is rectangular, when a width w3 is the largest among a width w1 in the x direction of the contact hole 140, a width w2 in the y direction and the width w3 in the diagonal direction, 1 μm≤w3≤100 μm. In FIG. 2, the second electrode and the third electrode are omitted to clearly show the contact hole.

The shape of the contact hole 140 is not limited to a rectangular shape. For example, if the contact hole 140 has a circular shape, the size of the diameter of the contact hole may be 1 μm or more and 100 μm or less. Additionally, for example, if the contact hole 140 has an elliptical shape, the major diameter of the contact hole 140 may be 1 μm or more and 100 μm or less.

Figure 4:
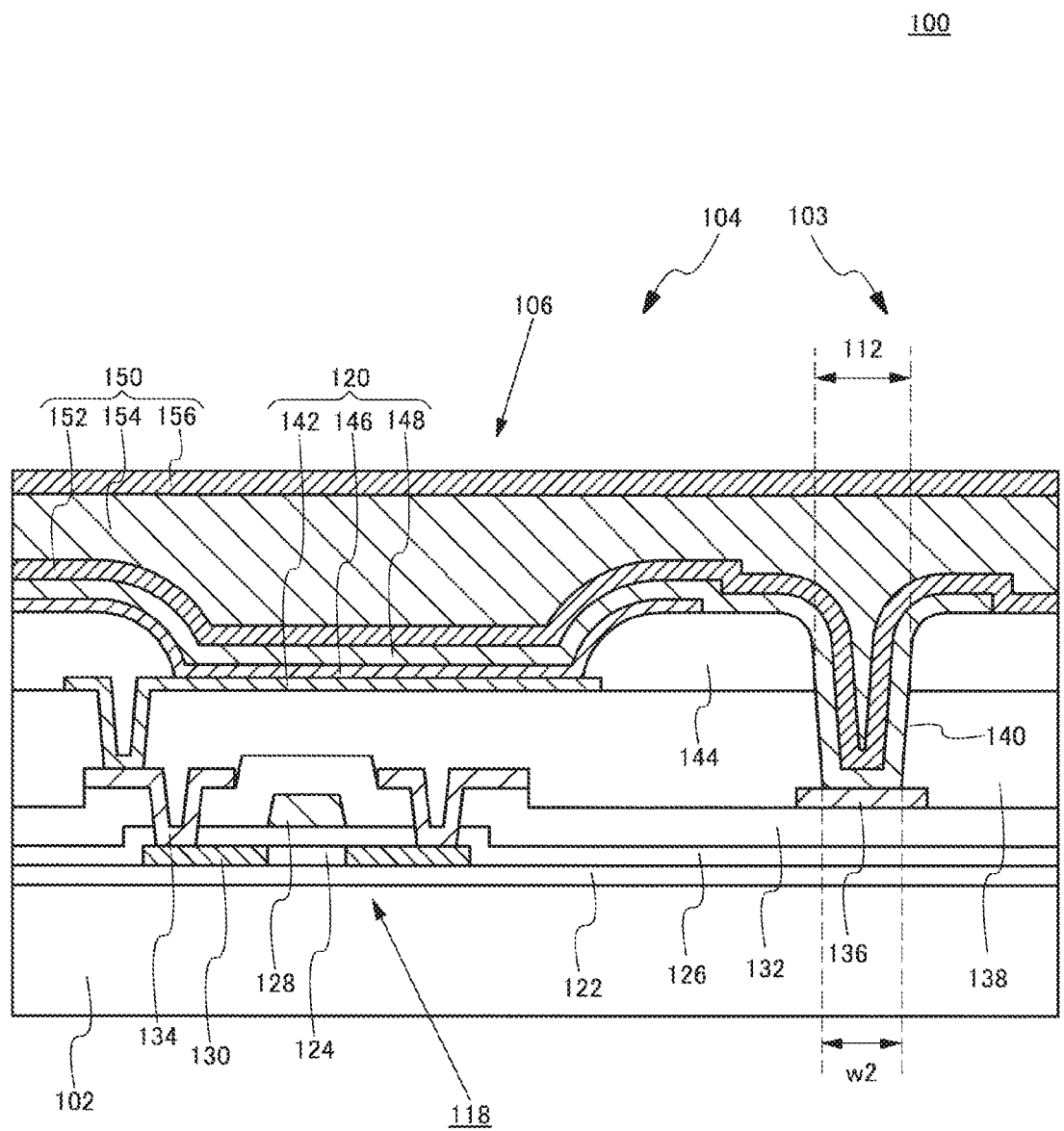
FIG. 4 is a cross-sectional view corresponding to line B-B in FIG. 2.

FIG. 4 shows a cross-sectional structure corresponding to line B-B in FIG. 2. As shown in FIG. 4, the pixels 106 are arranged above the substrate 102. The pixel 106 is configured to include a transistor 118 and an electroluminescent element 120.

As the substrate 102, a glass substrate, an organic resin film, or the like is applied. A base coat layer 122 is provided on a first surface of the substrate 102. The base coat layer 122 is formed of an inorganic insulating film. The transistor 118 has a structure in which a semiconductor layer 124, a gate insulating layer 126, and a gate electrode 128 are stacked. The transistor 118 has a source/drain region 130 with added impurity elements creating a one conductivity type semiconductor outside of a channel formation region which is a region in which the semiconductor layer 124 and the gate electrode 128 overlap.

The organic electroluminescent element 120 has a structure in which a first electrode 142, an organic layer 146, and a second electrode 148 are stacked. In the present embodiment, the first electrode 142 is an anode and the second electrode 148 is a cathode. The first electrode 142 is individually arranged in each pixel 106 and is electrically connected to the transistor 118. Specifically, the first electrode 142 is electrically connected to the source/drain electrode 134. The source/drain electrode 134 is also electrically connected to the source/drain region 130 of the transistor 118. By this, the organic electroluminescent element 120 is substantially electrically connected to the transistor 118. The light emission of the organic electroluminescent element 120 is controlled by the transistor 118. The second electrode 148 is formed substantially on one surface of the pixel region 104 and is electrically connected to the third electrode 136 in the contact region 112 outside the pixel region 104.

An interlayer insulating layer 132 is provided between the gate electrode 128 of the transistor 118 and the source/drain electrode 134. A planarization layer 138 is provided between the source/drain electrode 134 and the first electrode 142. Furthermore, above the planarization layer 138, a partition layer 144 which covers the peripheral portion of the first electrode 142 is provided.

In the stacked structure shown in FIG. 4, the base coat layer 122, the gate insulating layer 126, and the interlayer insulating layer 132 are formed of an inorganic insulating film. For example, a silicon oxide film, a silicon nitride film or the like is used as the inorganic insulating film. On the other hand, the planarization layer 138 and the partition layer 144 are formed of an organic insulating film. As the organic insulating film, for example, a polyimide film, an acrylic film, an epoxy film or the like is used. The semiconductor layer 124 is formed of a silicon semiconductor or an oxide semiconductor. The gate electrode 128 is formed of a metal material such as molybdenum (Mo), tungsten (W), or a molybdenum-tungsten alloy (MoW). The source/drain electrode 134 has, for example, a structure in which a titanium (Ti) film is stacked above and below an aluminum (Al) film. The third electrode 136 is formed in the same conductive layer as the source/drain electrode 134 or the same conductive layer as the gate electrode 128. FIG. 4 shows an embodiment in which the third electrode 136 is provided in the same conductive layer as the source/drain electrode 134.

In the contact region 112, the third electrode 136 is arranged below the planarization layer 138 and the partition layer 144 and is covered by the planarization layer 138 and the partition layer 144. For this reason, the upper surface of the third electrode 136 is exposed by the contact holes 140 formed in the planarization layer 138 and the partition layer 144. The second electrode 148 extends from the pixel region 104 to the peripheral region 103 and is electrically connected to the third electrode 136 in the contact hole 140.

A sealing layer 150 is provided above the organic electroluminescent element 120. The sealing layer 150 has a structure in which a plurality of films are stacked. FIG. 4 shows an example of a case in which the sealing layer 150 has a structure in which a first inorganic insulating film 152, an organic resin film 154, and a second inorganic insulating film 156 are stacked. The sealing efficiency of the sealing layer 150 is enhanced by a stacked structure in which different materials are combined. For example, even if a defect is included in the first inorganic sealing film 152, the sealing layer 150 has a structure in which the organic resin film 154 buries the defect portion, and the second inorganic insulating film 156 is further provided to compensate for the deterioration of the sealing efficiency due to the defect.

Figure 5:
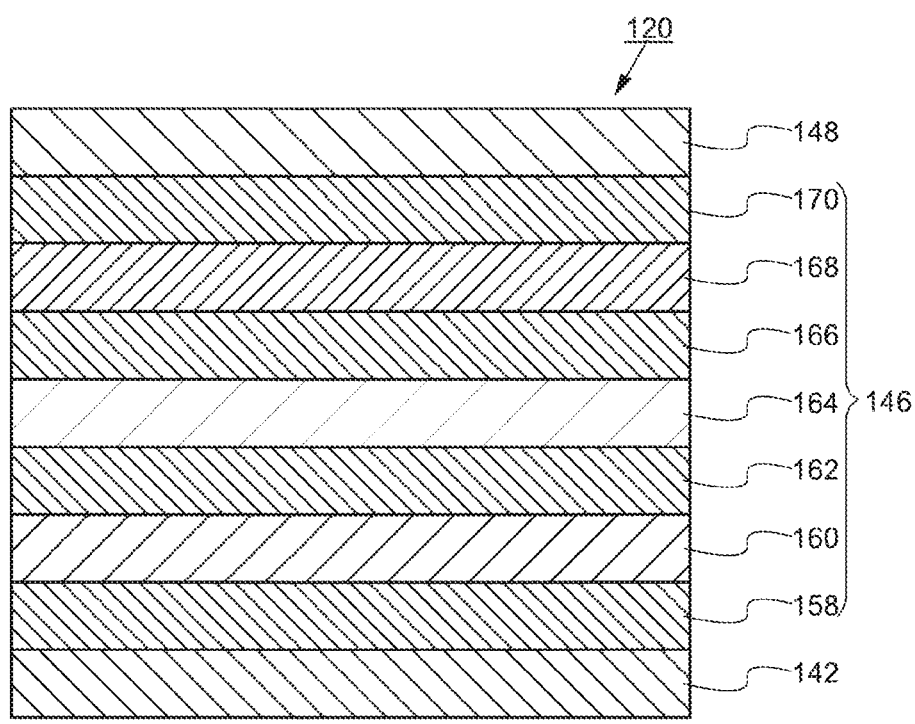
FIG. 5 is a diagram showing the details of an organic electroluminescent element.

FIG. 5 shows the details of the organic electroluminescent element 120. The organic electroluminescent element 120 has a structure in which the organic layer 146 is sandwiched between the first electrode 142 and the second electrode 148. In addition to a light emitting layer 164 including organic electroluminescent materials, the organic layer 146 may be stacked with a plurality of layers having different carrier transport properties (for example, carrier mobility). For example, the organic layer 146 may have a structure in which a hole injection layer 158, a hole transport layer 160, an electron blocking layer 162, the light emitting layer 164, a hole blocking layer 166, an electron transport layer 168, and an electron injection layer 170 are stacked from the first electrode 142 side.

The first electrode 142 of the organic electroluminescent element 120 is an anode and is formed of a conductive material having a large work function (specifically, 4.0 eV or greater) in order to inject holes into the organic layer 146. For example, the first electrode 142 may be manufactured using a conductive metal oxide material such as an indium tin oxide (ITO) or an indium zinc oxide (IZO). The first electrode 142 is manufactured by a sputtering method or a vacuum evaporation method using a conductive metal oxide material.

The hole injection layer 158 is preferably provided so as to lower the injection barrier of the holes from the first electrode 142 to the light emitting layer 164, and alleviates the difference in energy levels between the first electrode 142 and the hole transport layer 160 to facilitate hole injection. An organic material of a phthalocyanine type, an amine type or a carbazole type is used for the hole injection layer 158.

The hole transport layer material used for the hole transport layer 160 preferably has an appropriate ionization potential to increase the transfer rate of holes to the light emitting layer 164 described below, and at the same time, has a degree of electron affinity to prevent electrons from moving from the light emitting layer 164 to the hole transport layer 160. The hole transport layer 160 uses an organic material having a high hole mobility, such as an arylamine compound, an amine compound containing a carbazole group, or an amine compound containing a fluorene derivative.

The light emitting layer 164 may be formed of a combination of a host material and a dopant material. By using the combination of a host material and a dopant material such as this, the energy of the excited host molecule is transferred to the molecule of the dopant material, and the molecule of the dopant material releases energy and emits light. As a host compound, an electron transport material or a positive hole transport material may be used. For example, a host material of a quinolinol metal complex such as an Alq3 doped with a pyran derivative, a quinacridone derivative or a coumarin derivative, a host material of an electron transport material described below such as a bis (2-methyl-8-hydroxyquinoline)-4-phenylphenol-aluminum complex doped with a condensed polycyclic aromatic compound such as a perylene, a host material such as a hole transport material of a 4, 4'-bis (m-tolylphenylamino) biphenyl (TPD) doped with a rubrene, or a host material of a carbazole compound doped with an iridium complex or a platinum complex may be used.

The light emitting layer 164 may be provided corresponding to each color of red (R), green (G), and blue (B) using the materials described above, and may have structure in which a layer corresponding to red (R), a layer corresponding to green (G), a layer corresponding to blue (B) are stacked, or a layer corresponding to blue (B) and yellow (Y) are stacked in order to achieve white light emission.

The electron transport material used for the electron transport layer 168 is preferably a material having an appropriate ionization potential to increase the transfer rate of the electrons to the light emitting layer 164, and a degree of electron affinity preventing holes from moving from the light emitting layer 164 to the electron transport layer 168 side. The electron transport layer 168, for example, may be formed using an organic substance such as an oxadiazole derivative, a triazole derivative, or a quinolinol metal complex.

The electron injection layer 170 is provided to alleviate difficulty of electron injection caused by a large energy difference between the work function of the second electrode 148 and the electron affinity (LUMO level) of the electron transport layer 168. Specifically, the electron injection layer 170 may be formed of a substance with a small work function selected from an alkali metal such as a sodium (Na), a lithium (Li), and a cesium (Cs), an alkaline earth metal such as a calcium (Ca), a rare earth metal such as an ytterbium (Yb), a co-vapor deposited film of a lithium (Li) with an electron transport material, a fluoride such as a lithium fluoride (LiF), a cesium fluoride (CsF), an oxide such as a lithium oxide ($Li_2O$), or a carbonate such as a cesium carbonate (Cs2CO3).

The hole blocking layer 166 and the electron blocking layer 162 are provided so as to sandwich the light emitting layer 164. The hole blocking layer 166 is provided to suppresses the movement of holes from the side of the first electrode 142 through the light emitting layer 164 to the side of the second electrode 148, and the electron blocking layer 162 is provided to suppress the movement of electrons from the side of the second electrode 148 through the light emitting layer 164 to the side of the first electrode 142. By providing a hole blocking layer 166 and an electron blocking layer 162 such as this, the probability of holes and electrons recombining in the light emitting layer 164 is improved, and the light emission efficiency (internal quantum efficiency) of the organic electroluminescent element 120 may be improved.

The material of the electron blocking layer 162 is preferably formed of a material having a high LUMO level, that is, a low electron affinity, and a HOMO level close to the HOMO level of the hole transport layer 160. For example, the electron blocking layer 162 may be formed using an organic material such as a starburst amine-based material or a TPD.

The material of the hole blocking layer 166 is preferably formed of a material having a low HOMO level (a large ionization potential) and a LUMO level close to the LUMO level of the electron transport layer. For example, the hole blocking layer 166 may be formed using an organic material such as a triaryl borane derivative or BAlq.

The second electrode 148 is a cathode, and is preferably formed of a conductive material having a low work function in order to inject electrons into the organic layer 146. In the present embodiment, since the display device 100 is a top-emission type, the material of the second electrode 148 uses a transparent electrode or a semitransparent electrode. In order to improve the light emission efficiency of the organic electroluminescent element 120 by a microcavity effect, in the present embodiment, a semitransparent electrode formed of an alloy of magnesium and silver (an MgAg alloy) is used as the second electrode 148.

Additionally, the organic material which composes the organic layer 146 described above is merely an example, and a well-known material other than the above may be used. Furthermore, the stacked structure of the organic layer 146 is not limited to the structure shown in FIG. 5. For example, the organic layer 146 may have a structure in which the hole injection layer 158, the hole blocking layer 166, the electron blocking layer 162, and the like are appropriately omitted.

As described above, since the MgAg alloy which is the material of the second electrode 148 has low adhesion to the inorganic film, the second electrode 148 including the MgAg alloy has low adhesion to the third electrode 136. Therefore, in the present embodiment, the maximum distance between any two points is set to 1 µm or more and 100 µm or less in the outer periphery of the connection portion between the second electrode 148 and the third electrode 136 in the contact hole 140. By limiting the maximum distance between any two points in the connection portion between the second electrode 148 and the third electrode 136 to 100 µm or less, peeling of the second electrode 148 and the third electrode 136 may be prevented, and the yield of the display device 100 may be improved. The planarization layer 138 and the partition layer 144 which are in contact with the second electrode 148 in the periphery of the contact hole 140 and the side wall of the contact hole 140 are organic insulating films. For this reason, the adhesion between the second electrode 148 and the planarization layer 138 and the partition layer 144 is greater than the adhesion between the second electrode 148 and the third electrode 136. Therefore, the second electrode 148 is prevented from peeling off from the contact hole 140 because the second electrode 148 is in close contact with the planarization layer 138 and the partition layer 144 in the periphery of the contact hole 140 and the side wall thereof. As a result, peeling of the second electrode 148 and the third electrode 136 is prevented, and the yield of the display device 100 is improved.

In the first embodiment described above, a case in which the second electrode 148 overlaps substantially the entire surface of the contact region 112 is described. However, at least a portion of the second electrode 148 may overlap with the contact hole 140.

Second Embodiment

Figure 6:
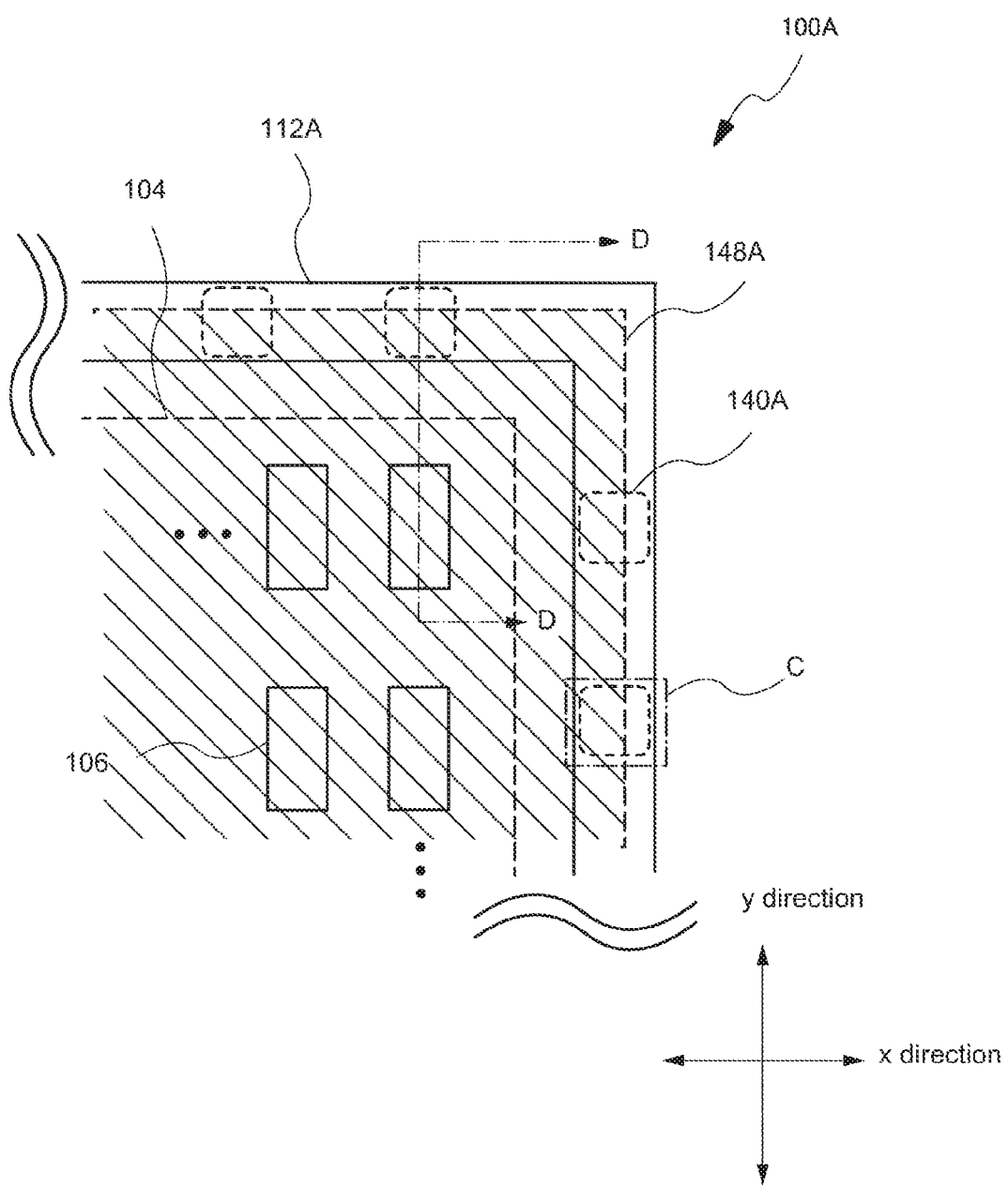
FIG. 6 is an enlarged view of a display device according to an embodiment of the present invention when viewed in a plan view.

FIG. 6 is an enlarged view of a display device 100A according to the present embodiment when viewed in a plan view. The schematic configuration of the display device 100A is substantially the same as the schematic configuration of the display device 100 described with reference to FIG. 1, thus, a detailed description is omitted.

As shown in FIG. 6, in the display device 100A according to the present embodiment, a portion of a second electrode 148A overlaps a contact hole 140A provided in a contact region 112A. Specifically, an edge portion of the second electrode 148A overlaps at least a portion of the contact hole 140A.

Figure 7:
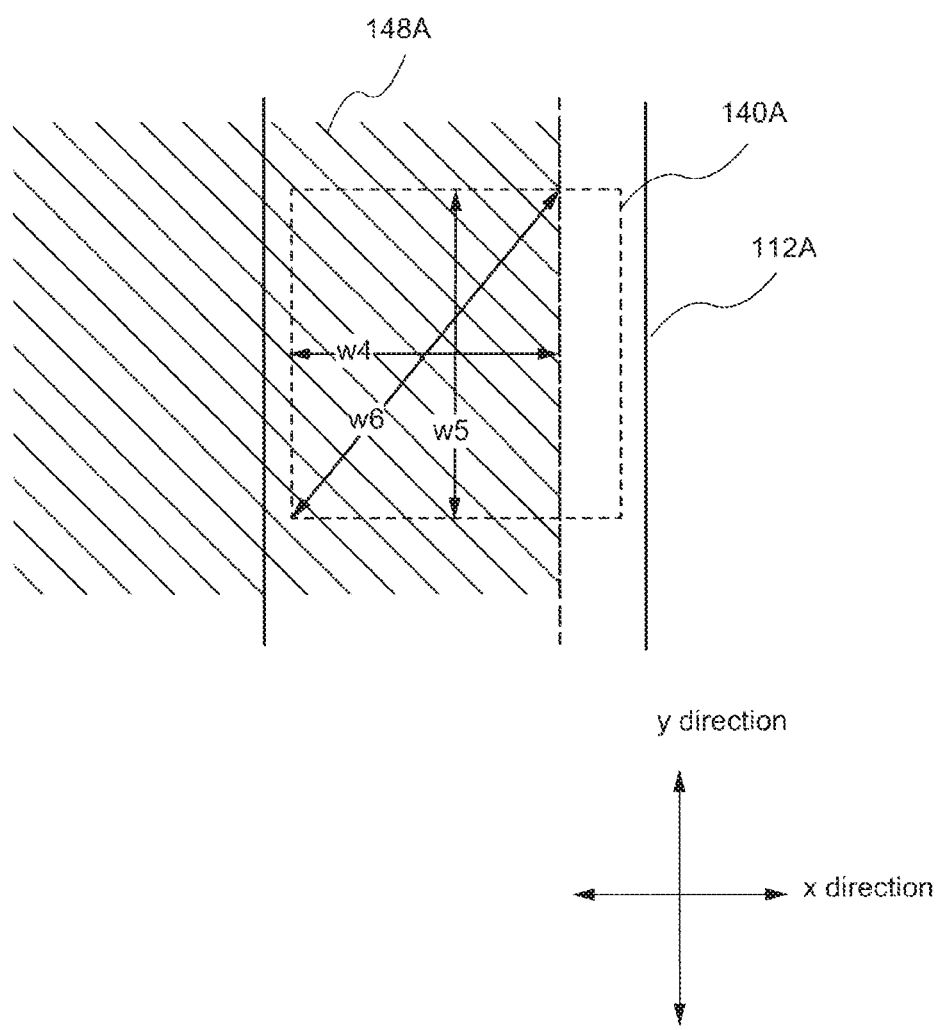
FIG. 7 is an enlarged view of a region C shown in FIG. 6.
Figure 8:
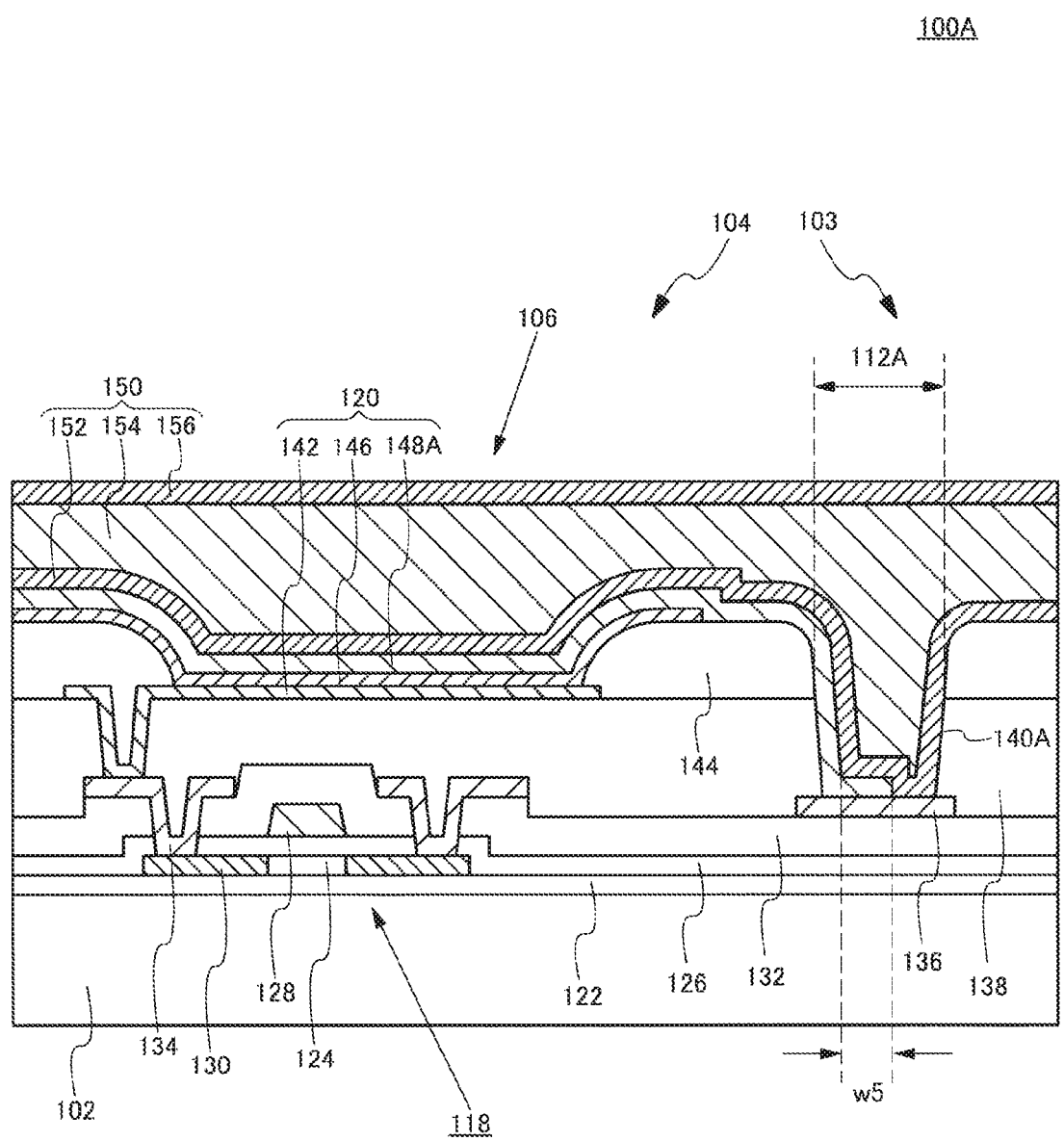
FIG. 8 is a cross-sectional view corresponding to line D-D in FIG. 6.

FIG. 7 is an enlarged view of a region C shown in FIG. 6. FIG. 8 shows a cross-sectional structure corresponding to line D-D in FIG. 6. As in the first embodiment, in the contact region 112A, the second electrode 148A is connected to the third electrode 136 via a plurality of contact holes 140A. The third electrode 136 is exposed by the contact hole 140A. As described above, in the present embodiment, the edge portion of the second electrode 148A overlaps with at least one portion of the contact hole 140A. In the outer periphery of the connection portion between the second electrode 148A and the third electrode 136 in the contact hole 140A, the maximum distance between any two points is 1 µm or more and 100 µm or less. As shown in FIG. 7, when the contact hole 140A is rectangular, and a width w6 is the largest among a width w4 in the x direction, the width w5 in the y direction, and the width w6 of the diagonal direction of the connection portion between the second electrode 148A and the third electrode 136 in the contact hole 140A, this is 1 µm≤w6≤100 µm. In FIG. 6 and FIG. 7, the third electrode 136 is omitted to clearly show the contact holes.

By limiting the maximum distance between any two points in the outer periphery of the connection portion between the second electrode 148A and the third electrode 136 to 100 µm or less, peeling between the second electrode 148A and the third electrode 136 may be prevented, and the yield of the display device 100A may be improved.

In the first and second embodiments described above, a case has been described in which the maximum distance between any two points in the outer periphery of the connection portion between the second electrodes 148 and 148A and the third electrode 136 in the contact holes 140 and 140A is limited to 1 μm or more and 100 μm or less. However, the connection mode of the second electrode and the third electrode in the contact region is not limited to this.

Third Embodiment

Figure 9:
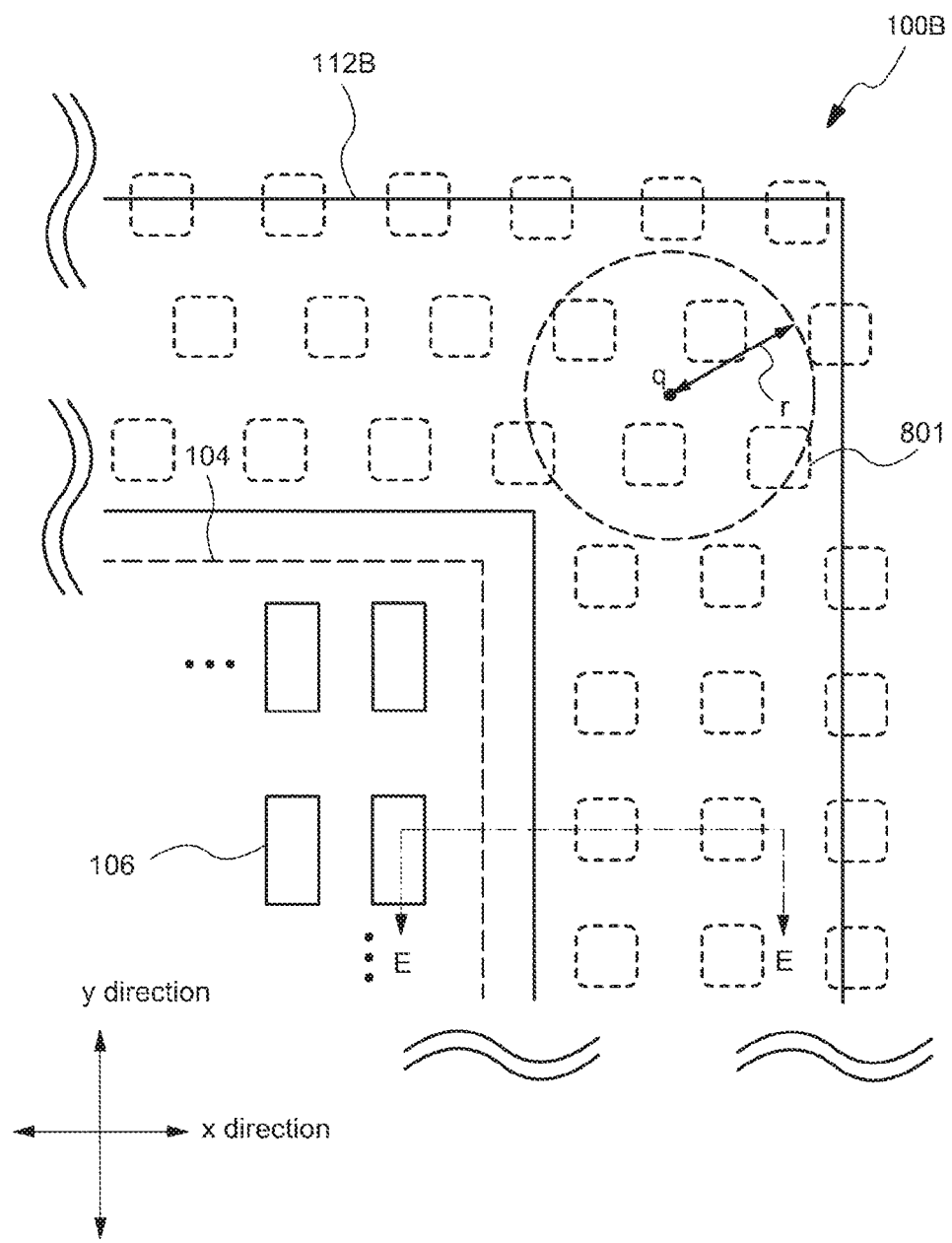
FIG. 9 is an enlarged view of a display device according to an embodiment of the present invention when viewed in a plan view.

FIG. 9 is an enlarged view of the display device 100B according to the present embodiment when viewed in a plan view. The schematic structure of the display device 100B is substantially the same as the schematic structure of the display device 100 described with reference to FIG. 1, thus, a detailed description is omitted.

As shown in FIG. 9, in the display device 100B according to the present embodiment, a plurality of island-shaped organic layers 801 are provided in the contact region 112B. In the contact region 112B, one or more island-shaped organic layers 801 are provided in a range of 1 μm to 100 μm from any point q. In other words, one or more island-shaped organic layers 801 are provided within a radius r (1≤r≤100) μm centered on any point q.

Figure 10:
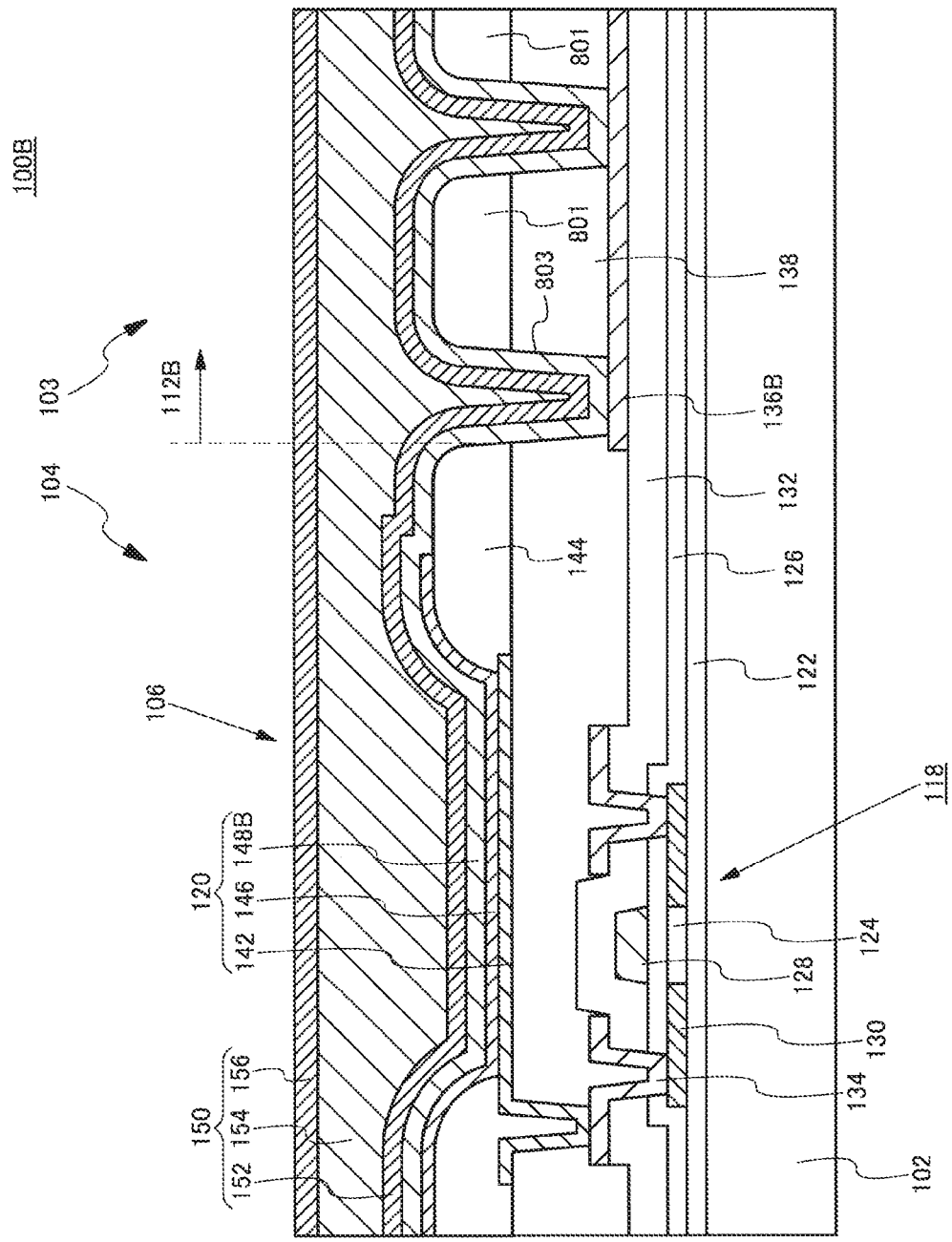
FIG. 10 is a cross-sectional view corresponding to line E-E in FIG. 9.

FIG. 10 is a cross-sectional view taken along line E-E in FIG. 9. As shown in FIG. 10, the island-shaped organic layer 801 is provided in the contact region 112B. The organic layer 801 may be formed of a same material as the partition layer 144. The organic layer 801 may be formed separated from the partition layer 144 by an opening 803 provided in the partition layer 144 and the planarization layer 138 extending to the contact region 112B. A second electrode 148B of the organic electroluminescent element 120 extends to the contact region 112B. In the contact region 112B, a third electrode 136B is exposed by the opening 803 provided between the partition layer 144 and the island-shaped organic layer 801 adjacent to each other, and between the island-shaped organic layers 801 adjacent to each other. The second electrode 148B is electrically connected to the third electrode 136B in the opening 803.

In the present embodiment, the size of the connection portion between the second electrode 148B and the third electrode 136B is set to 1 μm or more and 100 μm or less by providing one or more organic layers 801 within the range of 1 μm to 100 μm from any point q in the contact region 112B. By this, peeling of the second electrode 1488 and the third electrode 1368 may be prevented, and the yield of the display device 1008 may be improved. In the contact hole region 1128, the planarization layer 138 and the partition layer 144 or the island-shaped organic layer 801 which are in contact with the second electrode 148 in the periphery of the opening 803 and the side wall of the opening 803 are organic insulating films. For this reason, the adhesion between the second electrode 148 and the planarization layer 138 and the partition layer 144 or the island-shaped organic layer 801 is higher than the adhesion between the second electrode 148 and the third electrode 136. Therefore, the second electrode 148 is prevented from peeling from the opening 803 because the second electrode 148 is adhered to the planarization layer 138 and the partition layer 144 or the island-shaped organic layer 801 in the periphery of the opening 803 and the side wall thereof. As a result, peeling of the second electrode 148 and the third electrode 136 is prevented, and the yield of the display device 1008 is improved.

Example

An organic electroluminescent display device is manufactured on a 730 mm×920 mm glass substrate based on the organic electroluminescent display device 100 according to the first embodiment described with reference to FIG. 4 and FIG. 5. At this time, an organic electroluminescent display device in which the maximum distance between any two points on the outer periphery of the connection portion between a second electrode (cathode) and a third electrode connected to the second electrode in a contact hole is 100 μm is referred to as Example 1. Additionally, as a comparative example, an organic electroluminescent display device in which the maximum distance between any two points on the outer periphery of the connection portion between the second electrode (cathode) and the third electrode in the contact hole is 200 μm, and an organic electroluminescent display device in which the maximum difference between any two points on the outer periphery of the connection portion between the second electrode (cathode) and the third electrode is 500 μm have been prepared as comparative example 1 and comparative example 2.

The incidence rate of peeling between the second electrode and the third electrode in example 1 and comparative examples 1 and 2 described above is as shown in Table 1 below.

TABLE 1

| | Maximum Distance (μm) Between Any Two Points at the Connection Portion Between the Second Electrode and the Third Electrode | Incidence Rate of Peeling (%) |
|---|---|---|
| Example 1 | 100 | 0 |
| Comparative Example 1 | 200 | 20 |
| Comparative Example 2 | 500 | 70 |

As apparent from Table 1 above, by setting the maximum distance between any two points on the outer periphery of the connection portion between the second electrode and the third electrode in the contact region to 1 μm or more and 100 μm or less, it is understood that peeling of the second electrode and the third electrode is prevented and the yield of the display device is improved.

What is claimed is:

1. A display device comprising:
    a first electrode provided corresponding to each of a plurality of pixels in a pixel region in which the plurality of pixels is provided;
    a second electrode provided over the plurality of pixels and extending to a contact region adjacent to the pixel region in a peripheral region provided surrounding the pixel region;
    a light emitting layer provided between the first electrode and the second electrode;
    a third electrode provided in the contact region and electrically connected to the second electrode; and
    a plurality of island-shaped organic layers provided in the contact region, wherein
    at least one of the plurality of island-shaped organic layers overlaps with a circular region which completely overlaps with the contact region, and
    a radius of the circular region is 1 μm or more and 100 μm or less.

2. The display device according to claim 1, wherein the second electrode includes a MgAg alloy.

3. The display device according to claim 1, wherein the third electrode is connected to the second electrode in the contact region via an opening provided between a plurality of island-shaped organic layers adjacent to each other.

4. The display device according to claim 1, wherein the light emitting layer includes an organic electroluminescent material.

\* \* \* \* \*